(12) United States Patent
Shah et al.

(10) Patent No.: US 9,297,867 B2
(45) Date of Patent: Mar. 29, 2016

(54) RADIO FREQUNCY (RF) BODY COIL AND METHOD FOR TUNING AN RF BODY COIL FOR MAGNETIC RESONANCE IMAGING

(75) Inventors: Bijay Shah, Brookfield, WI (US); Ricardo Becerra, Waukesha, WI (US); Masahiro Fujimoto, Waukesha, WI (US); Zhentian Xie, Waukesha, WI (US)

(73) Assignee: General Electric Company, Schenectady, NY (US)

( * ) Notice: Subject to any disclaimer, the term of this patent is extended or adjusted under 35 U.S.C. 154(b) by 322 days.

(21) Appl. No.: 13/344,347

(22) Filed: Jan. 5, 2012

(65) Prior Publication Data

US 2013/0335087 A1 Dec. 19, 2013

(51) Int. Cl.
*G01R 33/36* (2006.01)
*G01R 33/34* (2006.01)

(52) U.S. Cl.
CPC ............ *G01R 33/36* (2013.01); *G01R 33/3628* (2013.01); *G01R 33/34007* (2013.01); *G01R 33/34076* (2013.01)

(58) Field of Classification Search
CPC ...................... G01R 33/3873; G01R 33/34007; G01R 33/34076; G01R 33/36; G01R 33/3628
USPC .................................................. 324/300–322
See application file for complete search history.

(56) References Cited

U.S. PATENT DOCUMENTS

| 4,885,539 | A | 12/1989 | Roemer et al. |
| 5,304,934 | A * | 4/1994 | Laskaris ............ G01R 33/3815 324/318 |
| 5,550,472 | A * | 8/1996 | Richard et al. ................. 324/320 |
| 6,232,779 | B1 | 5/2001 | Tropp et al. |
| 6,294,972 | B1 * | 9/2001 | Jesmanowicz et al. ........ 335/301 |
| 7,015,695 | B2 | 3/2006 | Tropp et al. |
| 2005/0206381 | A1 * | 9/2005 | Nistler et al. .................. 324/318 |
| 2007/0001675 | A1 * | 1/2007 | Kurome et al. ................ 324/318 |
| 2007/0030004 | A1 * | 2/2007 | Amor et al. .................... 324/318 |
| 2013/0278262 | A1 * | 10/2013 | Zhai et al. ...................... 324/309 |

FOREIGN PATENT DOCUMENTS

WO  WO2005/124379  12/2005

* cited by examiner

*Primary Examiner* — Melissa Koval
*Assistant Examiner* — Rishi Patel
(74) *Attorney, Agent, or Firm* — Dean D. Small; The Small Patent Law Group, LLC

(57) ABSTRACT

A radio frequency (RF) body coil includes a first end ring, a second end ring, a plurality of rungs connected between the first and second end rings, at least one shim holder coupled to the first end ring, and a RF shim configured to be at least partially inserted within the shim holder, the RF shim being repositionable within the shim holder to vary an operational frequency of the RF body coil. A magnetic resonance imaging system and a method of tuning the RF body coil are also described.

20 Claims, 7 Drawing Sheets

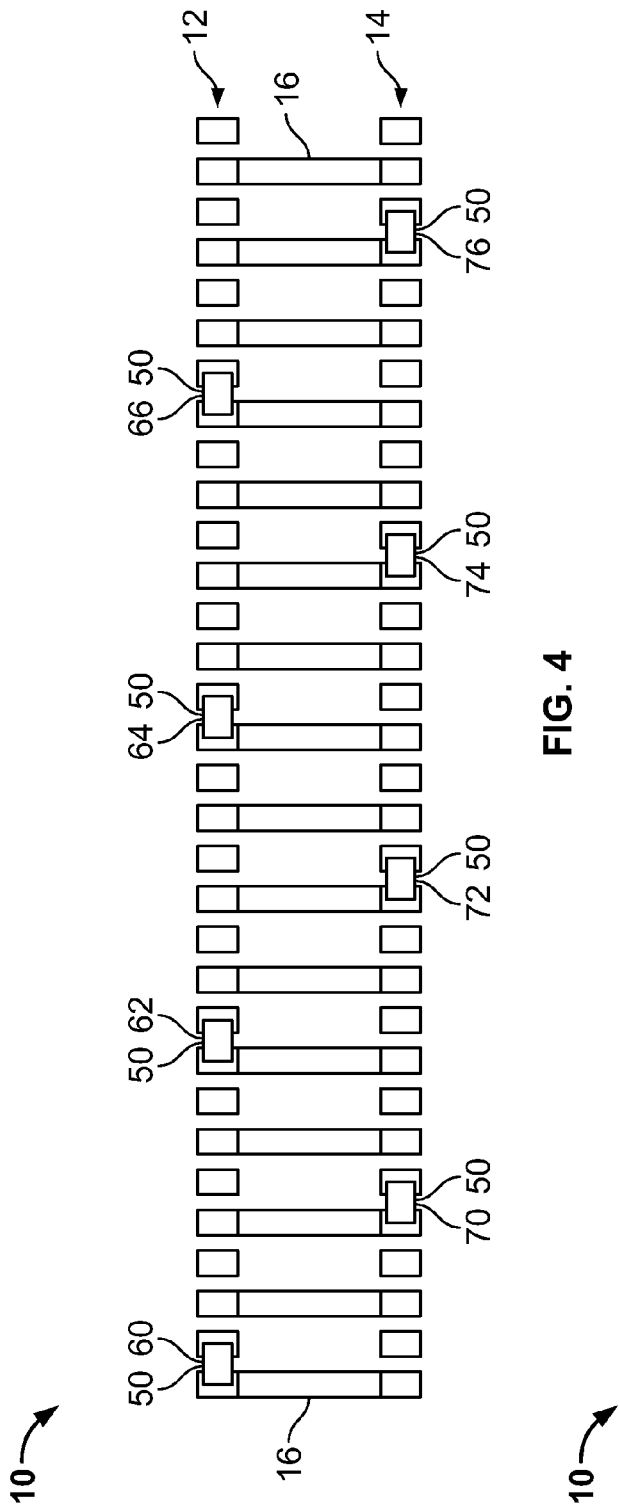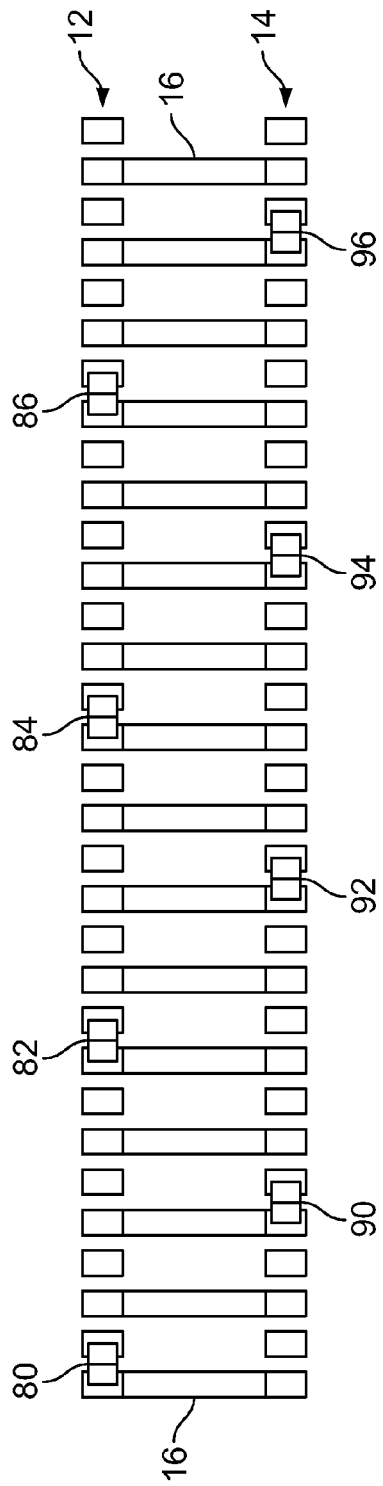

RADIO FREQUNCY (RF) BODY COIL AND METHOD FOR TUNING AN RF BODY COIL FOR MAGNETIC RESONANCE IMAGING

BACKGROUND OF THE INVENTION

The subject matter disclosed herein relates generally to magnetic resonance imaging (MRI) systems, and more particularly to systems and methods for tuning body coils in MRI systems.

MRI is a medical imaging modality that generates images of the inside of a human body without using x-rays or other ionizing radiation. MRI uses a magnet to create a strong, uniform, static magnetic field (i.e., the "main magnetic field") and gradient coils to produce smaller amplitude, spatially varying magnetic fields when a current is applied to the gradient coils. When a human body, or part of a human body, is placed in the main magnetic field, the nuclear spins that are associated with hydrogen nuclei in tissue water become polarized. The magnetic moments that are associated with these spins become preferentially aligned along the direction of the main magnetic field, resulting in a small net tissue magnetization along that axis (the "z axis," by convention) and the gradient coils encode the MR signal.

Radio frequency (RF) coils are used to create pulses of RF energy at or near the resonance frequency of the hydrogen nuclei, also referred to herein as the Larmor frequency. These RF coils are used to transmit RF excitation signals and receive MR signals used to form the images. Various types of RF coils may be used in an MRI system such as a whole-body RF coils and RF surface (or local) coils. Two common RF coil configurations are the birdcage coil and the transverse electromagnetic (TEM) coil.

At least some known RF coils utilize a plurality of capacitors to tune the RF coil to a desired frequency, e.g., the Larmor frequency. In some cases the RF coil may still not achieve the desired frequency. To achieve the desired frequency, the RF coil is typically removed from the MRI system and at least one of the capacitors may be replaced with another capacitor having a different capacitance. Optionally, capacitors may be added to, or removed from, the RF coil to achieve the desired frequency. The modified RF coil is then reinstalled into the MRI system and the frequency of the modified RF coil is measured to ensure that the RF coil is operating at the desired frequency.

However, the RF coil may need to be retuned several times to achieve the desired frequency. Thus, the for each retuning operation, the RF coil is removed from the MRI system, at least one of the capacitors is replaced with another capacitor having a different capacitance, the RF coil is retested and then reinstalled in the MRI system. Thus, tuning a conventional RF coil is time consuming and may require that the RF coil be removed, modified, and then reinstalled into the MRI system several times, thus increasing the time and cost of tuning the RF coil to the desired operational frequency.

BRIEF DESCRIPTION OF THE INVENTION

In one embodiment, a radio frequency (RF) body coil is provided. The RF body coil includes a first end ring, a second end ring, a plurality of rungs connected between the first and second end rings, at least one shim holder coupled to the first end ring, and a RF shim configured to be at least partially inserted within the shim holder, the RF shim being repositionable within the shim holder to vary an operational frequency of the RF body coil.

In another embodiment, a magnetic resonance imaging (MRI) system is provided. The MRI system includes a radio-frequency (RF) birdcage coil having a first end ring, a second end ring, and a plurality of rungs connected therebetween, at least one shim holder coupled to the first end ring, and a RF shim configured to be at least partially inserted within the shim holder, the RF shim being repositionable within the shim holder to vary an operational frequency of the RF body coil.

In a further embodiment, a method for tuning a radio frequency (RF) body coil is provided. The RF body coil includes a first end ring, a second end ring, and a plurality of rungs connected therebetween. The method includes coupling at least one RF shim holder to the first end ring, obtaining an initial operational frequency of the RF body coil, and adjusting an RF shim disposed within the shim holder until the RF body coil is operating at a predetermined operational frequency.

BRIEF DESCRIPTION OF THE DRAWINGS

FIG. 4 is a plan view of an exemplary RF body coil formed in accordance with various embodiments.

FIG. 5 is a plan view of another exemplary RF body coil formed in accordance with various embodiments.

DETAILED DESCRIPTION OF THE INVENTION

Figure 1:
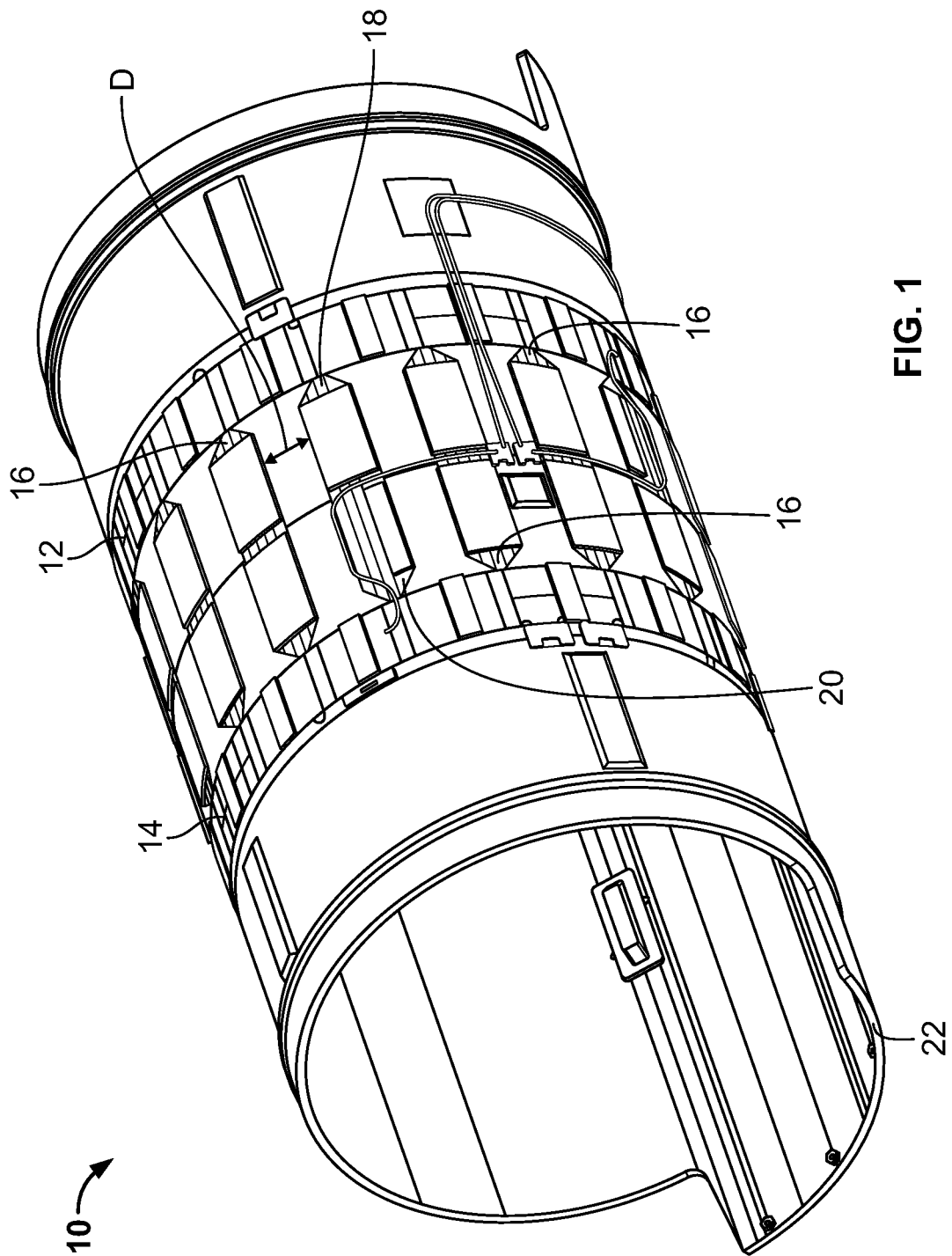
FIG. 1 is a perspective view of an exemplary radio frequency (RF) body coil formed in accordance with various embodiments.

Embodiments of the invention will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (e.g., processors, controllers or memories) may be implemented in a single piece of hardware (e.g., a general purpose signal processor or random access memory, hard disk, or the like) or multiple pieces of hardware. Similarly, the programs may be stand alone programs, may be incorporated as subroutines in an operating system, may be functions in an installed software package, and the like. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments provide a method for tuning a radio frequency (RF) body coil that using a plurality of dielectric shims. The RF body coil may be embodied, for example, as a RF birdcage coil or a transverse electromagnetic (TEM) coil. The RF body coil generally includes a pair of end rings and a plurality of rungs that are connected between the pair of end rings. In various embodiments, the RF body coil further includes a plurality of dielectric shims that are installed on the end rings. The RF body coil may be tuned to a desired frequency by adding and/or removing the dielectric shims to/from the RF body coil. The RF body coil may also be tuned to a desired frequency by adjusting the dielectric shims.

FIG. 1 is a perspective view of an exemplary RF body coil 10. In the exemplary embodiment, the RF body coil 10 is a RF birdcage coil that includes a first end ring 12, a second end ring 14 and a plurality of rungs 16 that are electrically coupled between the first and second end rings 12 and 14, respectively. Each of the plurality of rungs 16 includes a first end 18 and a second opposite end 20. In the exemplary embodiment, the first end 18 of each rung 16 is electrically coupled to the first end ring 12 and the second end 20 of each rung 16 is electrically coupled to the second end ring 14. The rungs 16 may be coupled to each of the end rings 12 and 14 using, for example, a soldering procedure. In other embodiments, the rungs 16 may be coupled to each of the end rings 12 and 14 using, for example, an electrically conductive adhesive. In the exemplary embodiment, the end rings 12 and 14 and the rungs 16 are mounted on a coil former 22 to form the RF body coil 10.

As shown in FIG. 1, the first end ring 12 and the second end ring 14 oppose one another in a spaced-apart relationship and are connected by the plurality of rungs 16 such that the RF body coil 10 is substantially cylindrical in shape with annular ends. The rungs 16 are arranged circumferentially around the end rings 12 and 14 and are, in the exemplary embodiment, uniformly spaced apart from one another. It should be realized that the RF body coil 10 may have fewer or more rungs 16 than the illustrated embodiment. The quantity of rungs 16 may be selected based on the requirements of a particular imaging application. For example, the quantity of rungs 16 may be selected based on a desired field-of-view (FOV), a desired image resolution, a desired power requirement and/or a desired imaging speed. More specifically, the RF body coil 10 includes N rungs 16 which are radially separated from each other by a distance D. In various embodiments, N may be 8, 16, 24, or 32, for example. In the exemplary embodiment, N=16.

In the exemplary embodiment, each rung 16 includes a plurality of capacitors (not shown). The capacitors may be, for example, low inductance end ring capacitors that electrically connect the rungs 16 together. The rungs 16 may be constructed from a material having high electrical conductivity, such as, for example, copper.

The RF body coil 10 shown in FIG. 1 may be used as a whole-body RF coil or as a surface (or local) coil. For a whole-body RF coil, the dimensions of the RF body coil 10 are configured so that the RF body coil 10 may be installed inside a superconducting magnet assembly (shown in FIG. 12). For a surface or local coil (e.g., a head coil), the dimensions of RF body coil 10 are configured so that the RF coil 10 may be disposed within a bore 446, also shown in FIG. 12.

Figure 2:
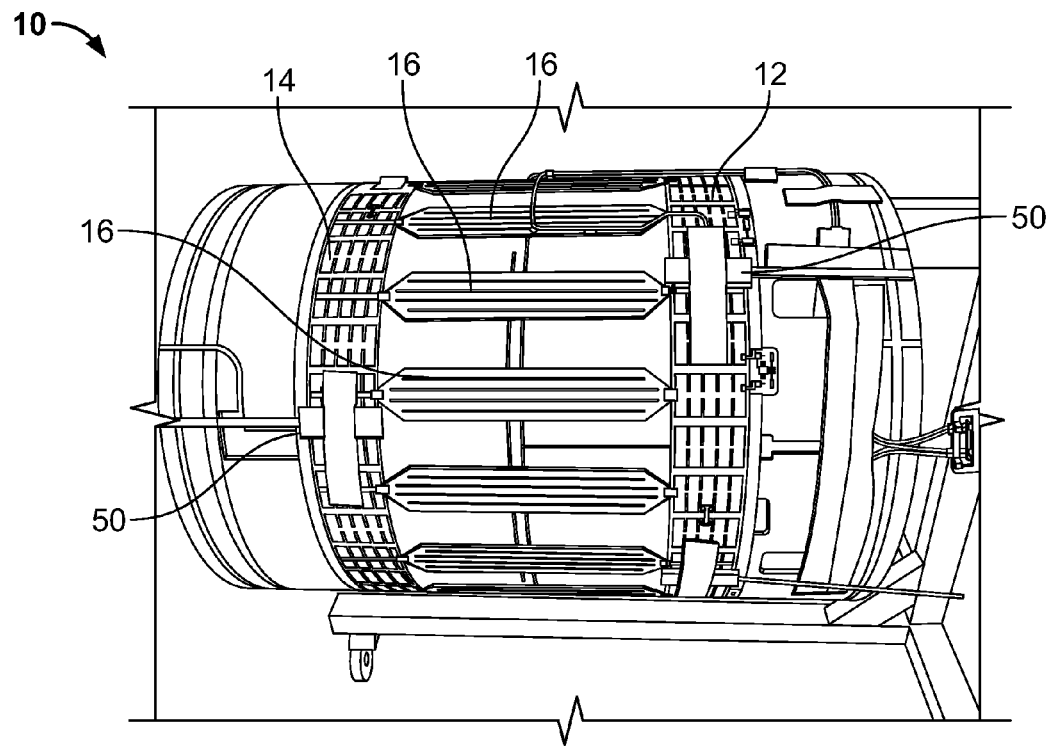
FIG. 2 is a side view of the RF body coil shown in FIG. 1.
Figure 3:
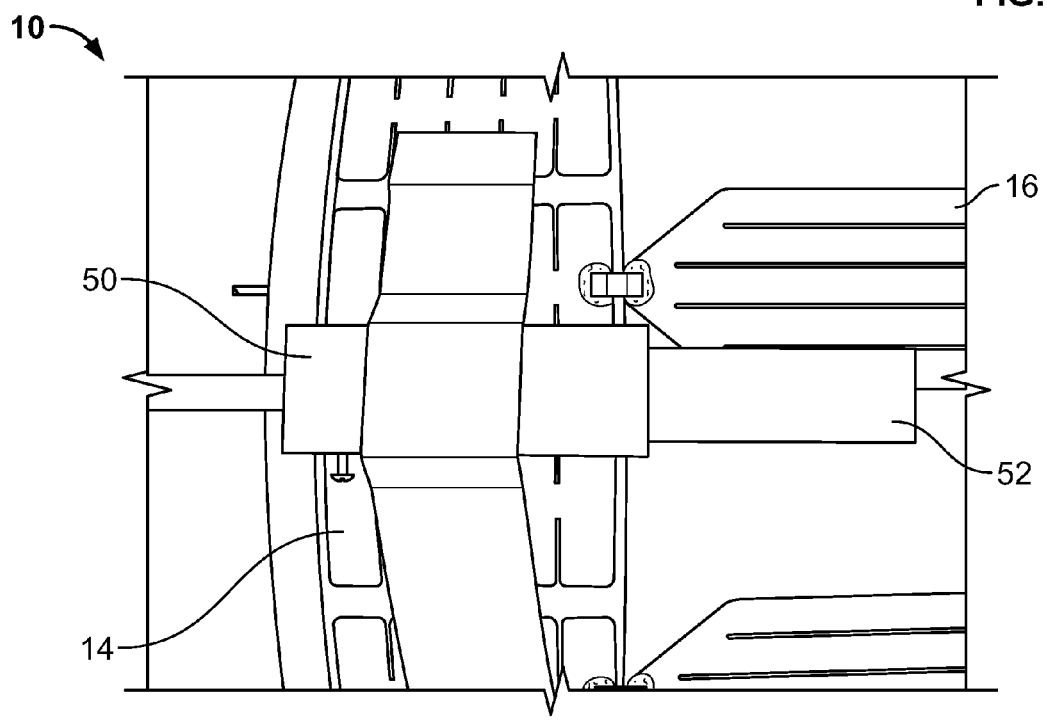
FIG. 3 is a side view of a portion of the RF body coil shown in FIG. 2.

FIG. 2 is a side view of the RF body coil 10 shown in FIG. 1. FIG. 3 is a detailed view of a portion of the RF body coil 10 shown in FIG. 2. In the various embodiments, the RF body coil 10 also includes a plurality of shim holders 50 that are each configured to receive an RF shim 52 therein. In operation, the RF shims 52 are utilized to tune the frequency of the RF body coil 10 to a desired frequency, such as for example, the Larmor frequency of hydrogen nuclei as is explained in more detail below.

FIG. 4 is a plan view of the RF body coil 10 shown in FIGS. 1-3. As explained above, the RF body coil 10 includes N rungs 16. In various embodiments, the RF body coil 10 also includes a plurality of shim holders 50 that are each configured to receive a respective RF shim 52 therein. For example, in one embodiment, the RF body coil 10 includes sixteen rungs 16. Accordingly, in one embodiment, the RF body coil 10 may also include eight shim holders 50 wherein four shim holders 50 are coupled to the first end ring 12 and four shim holders 50 are coupled to the second end ring 14.

The shim holders 50 coupled to the first end ring 12 are each separated by a distance of approximately 90 radial degrees. For example, a first shim holder 60 may be positioned on the first end ring 12 at 0 degrees, a second shim holder 62 may be positioned on the first end ring 12 at approximately 90 degrees, a third shim holder 64 may be positioned on the first end ring 12 at approximately 180 degrees, and a fourth shim holder 66 may be positioned on the first end ring 12 at approximately 270 degrees. Additionally, a fifth shim holder 70 may be positioned on the second end ring 12 at approximately 45 degrees, a sixth shim holder 72 may be positioned on the second end ring 12 at approximately 135 degrees, a seventh shim holder 74 may be positioned on the second end ring 12 at approximately 225 degrees, and an eighth shim holder 76 may be positioned on the second end ring 12 at approximately 315 degrees.

In the exemplary embodiment, the shim holders 50, and the shims 52, are spaced approximately equidistantly around the first and second end rings 12 and 14, respectively, to facilitate maintaining the electrical balance of the RF body coil 10. Moreover, in various embodiments, the shim holders 50, and the shims 52, mounted on the second end ring 14 are shifted with respective to the shim holders 50, and shims 52, mounted on the first end ring 12. For example, as discussed above, the shim holders 60, 62, 64, and 66 mounted on the first end ring 12 are each separated by approximately 90 degrees. Moreover, the shim holders 70, 72, 74, and 76 mounted on the second end ring 14 are also each separated by approximately 90 degrees. However, in various embodiments, the shim holders 60, 62, 64, and 66 are shifted in radial position from the shim holders 70, 72, 74, and 76 by approximately 45 degrees. It should be realized that the separation between shim holders 50 on the first and second end rings 12 and 14, respectively is based on each of the end rings 12 and 14 having four shim holders 50. However, assuming that each end ring 12 and 14 has eight shim holders 50, each of the shim holders 50 would be radially separated by approximately 45 degrees.

In various embodiments, the quantity of shim holders 50 installed on the end rings 12 and 14, respectively is based on a desired frequency shift to be applied to the RF body coil 10. More specifically, increasing the quantity of shim holders 50, and shims 52, increases a frequency range over which the RF body coil 10 may be adjusted. Moreover, reducing the quantity of shim holders 50, and shims 52, decreases the frequency range over which the RF body coil 10 may be adjusted. In the exemplary embodiment, each respective shim holder 50, and shim 52, therefore enables the RF frequency of the RF body coil 10 to be adjusted a predetermined amount. Therefore, either increasing or decreasing the quantity of shim holders 50, and shims 52, increases or decreases the amount of RF frequency adjustment that may be applied to the RF body coil 10, as is described in more detail below.

In various embodiments, the RF body coil 10 may include a plurality of shim holders 50, and shims 52, that are disposed at the same approximate location on the end rings 12 and 14, respectively. For example, FIG. 5 is another plan view of the RF body coil 10 shown as including a plurality of shim holders 50 located at the same approximate positions on the end rings 12 and 14, respectively. As shown in FIG. 5, the RF body coil 10 may include a first pair of RF shim holders 80 positioned on the first end ring 12 at 0 degrees, a second pair of RF shim holders 82 may be positioned on the first end ring 12 at approximately 90 degrees, a third pair of RF shim holders 84 may be positioned on the first end ring 12 at approximately 180 degrees, and a fourth pair of RF shim holders 86 may be positioned on the first end ring 12 at approximately 270 degrees. Additionally, a fifth pair of shim RF holders 90 may be positioned on the second end ring 12 at approximately 45 degrees, a sixth pair of RF shim holders 92 may be positioned on the second end ring 12 at approximately 135 degrees, a seventh pair of RF shim holders 94 may be positioned on the second end ring 12 at approximately 225 degrees, and an eighth pair of RF shim holders 96 may be positioned on the second end ring 12 at approximately 315 degrees.

In various embodiments, the RF body coil may include N rungs and N shim holders 50 mounted to each end ring 12 and 14, respectively. For example, in one embodiment, the RF body coil 10 includes sixteen rungs 16. Accordingly, the RF body coil 10 may include 16 shim holders 50 coupled to the first end ring 12 and equidistantly spaced around the first end ring 12. Moreover, the RF body coil 10 may include 16 shim holders 50 coupled to the second end ring 14 and equidistantly spaced around the first end ring 12.

Figure 6:
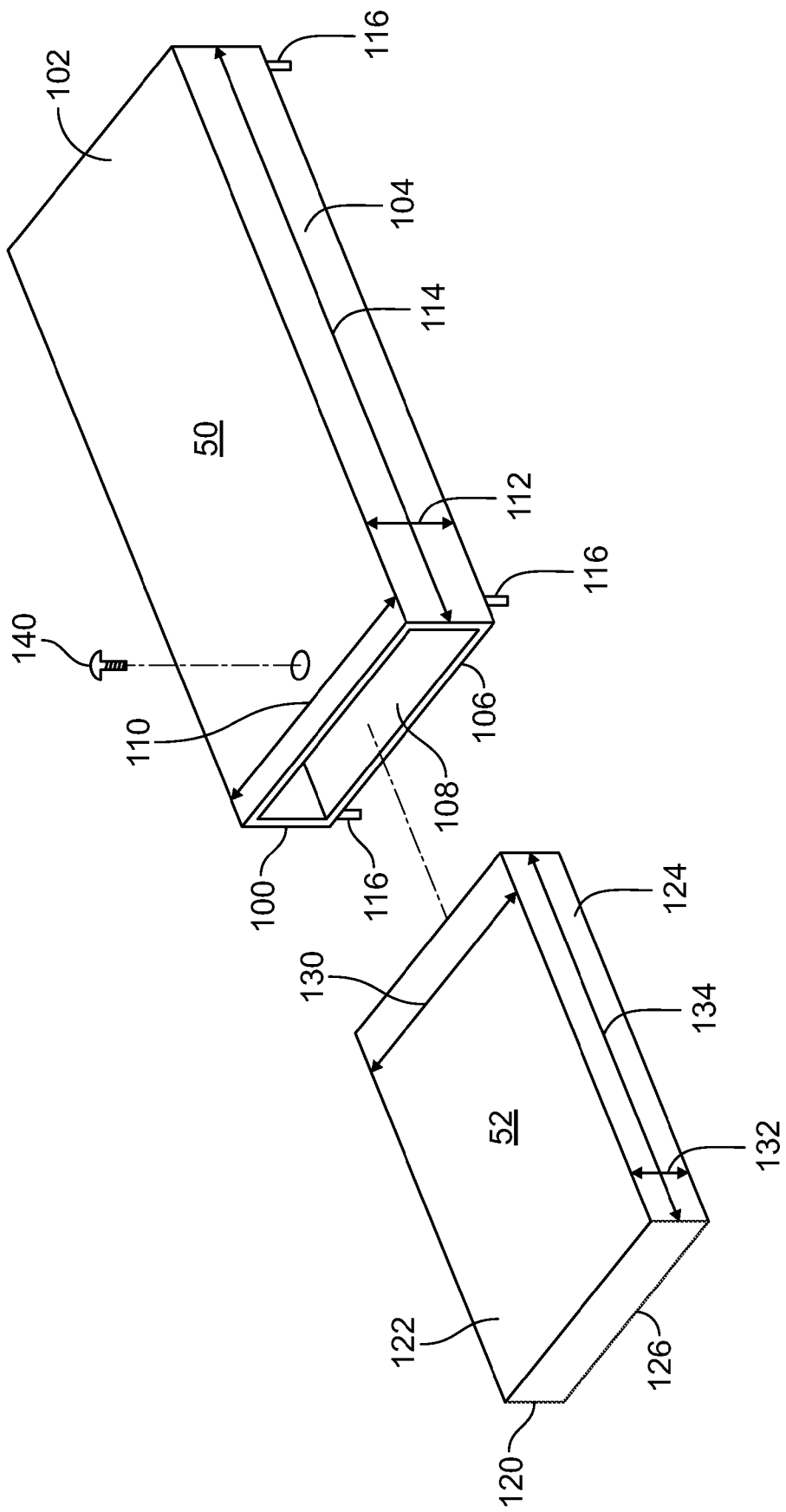
FIG. 6 is a perspective view of an exemplary shim holder and RF shim that may be utilized with the RF body coil shown in FIG. 1 in accordance with various embodiments.

FIG. 6 is an exploded view of the shim holder 50 and the RF shim 52 described above. The shim holder 50 includes a first side 100, a second side 102, a third side 104 and a fourth side 106. In the exemplary embodiment, the first side 100, the second side 102, the third side 104, and the fourth side 106 are substantially planar or flat. Moreover, the first side 100 is substantially parallel to the third side 104 and the second side 102 is substantially parallel to the fourth side 106 such that the sides 100, 102, 104 and 106 together form a substantially rectangular shape having a substantially rectangular opening 108 therein. The opening 108 has a width 110, a height 112, and a depth 114 that together define the volume of the opening 108. In various embodiments, the shim holder 50 also includes a set of stanchions 116 that are utilized to couple the shim holder 50 to end rings as is discussed in more detail below.

In various embodiments, the shim holder 50 is fabricated from a dielectric material. Such dielectric materials may include, for example, FR4. FR4 is dielectric material that may be, for example, a fiberglass reinforced epoxy laminate that is flame retardant (FR) and self-extinguishing. It should be realized that although the shim holder 50 is described in various embodiments as being fabricated using FR4, the shim holders 50 may be fabricated using any suitable dielectric material.

The RF shim 52 includes a first side 120, a second side 122, a third side 124 and a fourth side 126. In the exemplary embodiment, the first side 120, the second side 122, the third side 124, and the fourth side 126 are substantially planar or flat. Moreover, the first side 120 is substantially parallel to the third side 124 and the second side 122 is substantially parallel to the fourth side 126 such that the sides 120, 122, 124 and 126 together define a substantially rectangular shape. The RF shim 52 also has a width 130, a height 132, and a length 134 that together define the volume of the RF shim.

In the exemplary embodiment, the volume of the shim holder 50 is greater than the volume of the RF shim 52 to enable the RF shim 52 to be inserted into the shim holder 50. Moreover, the RF shim 52 has substantially the same shape as the shim holder opening 108 to enable the RF shim 52 to be inserted into the shim holder opening 108. In various embodiments, the RF shim 52 is configured to be repositioned within the shim holder opening 108 at a plurality of positions based on a RF frequency adjustment desired which will be explained in further detail below. Once the RF shim 52 is positioned at a desired position within the shim holder opening 108, a mechanical fastener 140 may be utilized to secure the RF shim 52 at a fixed position within the shim holder opening 108.

In various embodiments, the RF shim 52 is fabricated from a dielectric material. Such dielectric materials may include, for example, FR4. It should be realized that although the RF shim 52 is described in various embodiments as being fabricated using FR4, the RF shim 52 may be fabricated using any suitable dielectric material.

Figure 7:
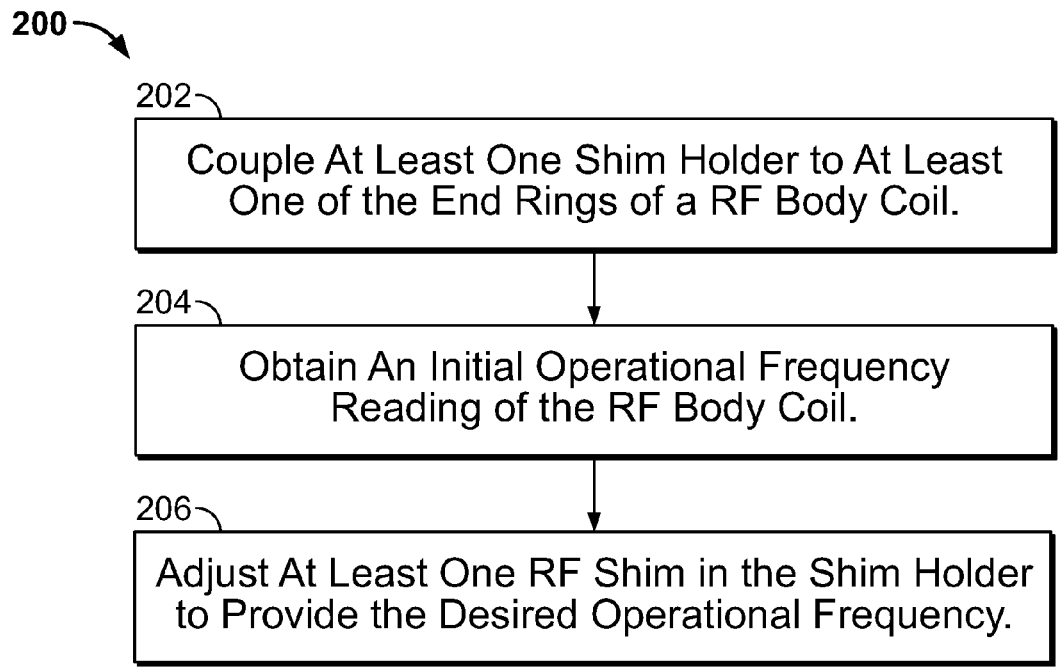
FIG. 7 is a flowchart of an exemplary method of tuning an exemplary RF body coil.

FIG. 7 is a flowchart illustrating an exemplary method 200 of tuning an exemplary RF body coil, such as the RF body coil 10 described above. At 202, at least one shim holder 50 is coupled to at least one of the end rings 12 or 14. In various embodiments, a plurality of shim holders 50 may be coupled to each respective end ring 12 and 14. For example, in the exemplary embodiment, four shim holders 50 are coupled to the first end ring 12 and four shim holders are coupled to the second end ring 14.

Figure 8:
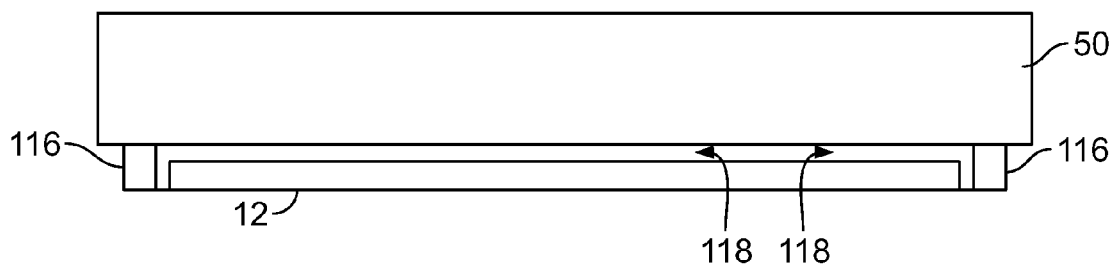
FIG. 8 is a side view of the shim holder shown in FIG. 6.

FIG. 8 is an end view of a portion of the RF body coil 10 including a single shim holder 50 coupled to the end ring 12. As discussed above, in various embodiments, the shim holder 50 includes a plurality of stanchions 116. To couple the shim holder 50 to the end ring 12, the shim holder 50 is positioned such that the stanchions 116 are disposed on both sides of the end ring 12, such that the end ring 12 bridges the shim holder 50 above the end ring 12. Moreover, in the exemplary embodiment, the gaps 118 are made as small as possible while still maintaining some distance between the shim holder 50 and the end ring 12. The shim holder 50 may then be secured to the end ring 12 using, for example, an adhesive tape, as shown in FIG. 3. Additional shim holders 50 may be secured to each respective end ring 12 and 14, as described above.

Referring again to FIG. 7, at 204, an initial operational frequency reading of the RF body coil 10 is obtained. For example, FIG. 9 is a graphical illustration of various operational frequencies of the RF body coil 10 wherein the x-axis represents angular orientation within the body coil at which frequency is measured and the y-axis represents the measured frequency.

Figure 9:
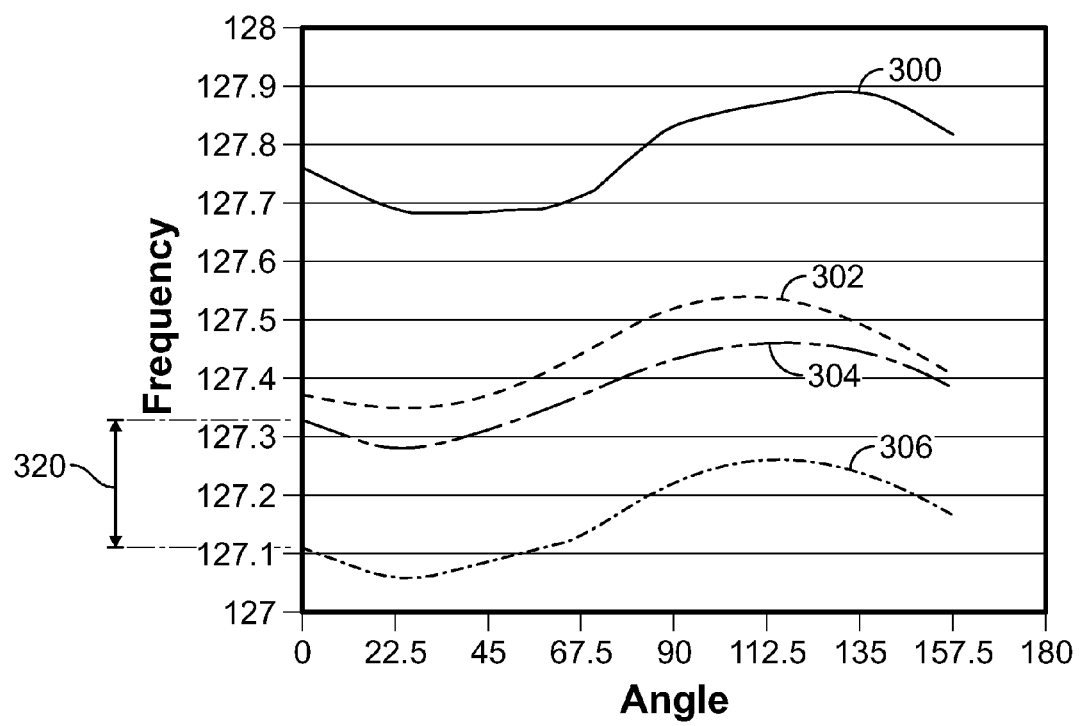
FIG. 9 is a graphical illustration of exemplary operational frequencies generated in accordance with various embodiments.

As shown in FIG. 9, a line 300 represents the operational frequency of the RF body coil 10 with no shim holders 50 installed. A line 302 represents the represents the operational frequency of the RF body coil 10 after the shim holders have been installed at 202. As discussed above, the shim holders 50 are preferably fabricated from material with lower dielectric strength. Accordingly, the shim holders 50 have some small effect on the operational frequency of the RF body coil 10 as shown in FIG. 9. Therefore, a smaller quantity of shim holders 50 will result in a smaller decrease in the operational frequency of the RF body coil 10. Whereas, a larger quantity of shim holders 50 will have a produce a relatively larger shift in the operational frequency of the RF body coil 10.

In the exemplary embodiment, the RF body coil 10 is tuned to a desired Larmor frequency of hydrogen nuclei. Accordingly, in various embodiments, for a 3 Tesla (T) imaging system, the desired Larmor frequency is approximately 127.72 Hz. It should be realized that the RF body coil 10 may be tuned to any desired operational frequency using the methods and devices described herein.

Figure 10:
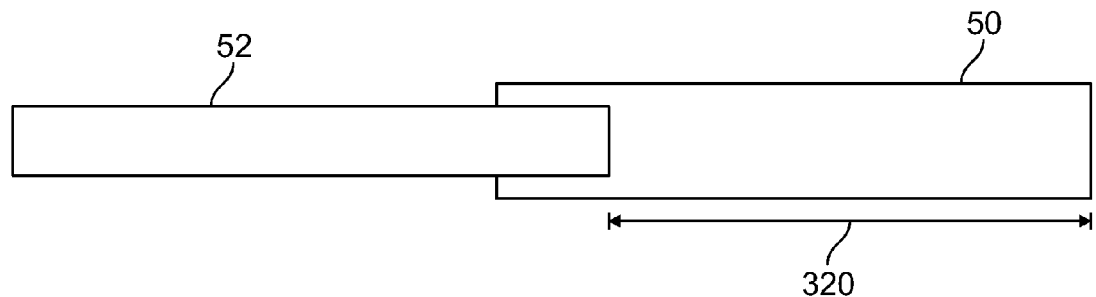
FIG. 10 is a side view of the shim holder and the RF shim shown in FIG. 6 in a first operational position.
Figure 11:
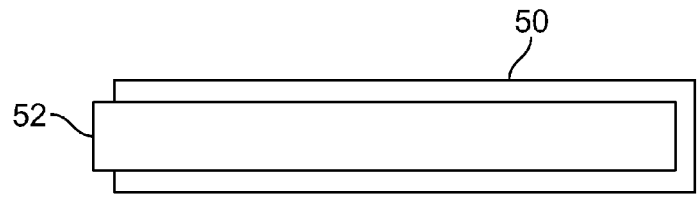
FIG. 11 is a side view of the shim holder and the RF shim shown in FIG. 6 in a second operational position.

Referring again to FIG. 7, at 206, the RF shims 52 are adjusted to provide the desired operational frequency, e.g. 127.72 Hz. As discussed above, in the exemplary embodiment, the RF shims 52 are movable into and out of the shim holder 50. Moving the RF shims 52 into and out of the shim holders 50 causes a change in the operational frequency of the RF body coil 10. For example, FIG. 10 is a side view of the RF shim 52 partially inserted into the shim holder 50. More specifically, FIG. 10 illustrates the RF shim 52 at an initial position. FIG. 11 is a side view of the RF shim 52 fully inserted into the shim holder 50, e.g. at a fully inserted position. As shown in FIGS. 10 and 11, the RF shim 52 is capable of traveling a predefined distance 320 within the shim holder 50.

In various embodiments, the predefined distance 320 may represent a range of operational frequencies. For example, when the RF shim 52 is positioned at the initial position as shown in FIG. 10, the operational frequency of the RF body coil 10 is reduced as shown by the line 302 in FIG. 9. Moreover, when the RF shim 52 is positioned at the fully inserted position as shown in FIG. 11, the operational frequency of the RF body coil 10 is further reduced as shown by the line 306 in FIG. 9. In operation, the range of the operational frequency shift 320 is based on the quantity of the RF shim 52 material inserted into the shim holder 50. Thus, when the RF shim 52 is fully inserted into the shim holder 50, more dielectric material is disposed over the end ring, and the operational frequency of the RF body coil 10 is reduced. It should be realized that the operational frequency of the RF body coil 10 may be adjusted to any point within the range 320, as defined by the lines 304 and 306 by merely pushing the RF shim 52 into the shim holder 50 to reduce the operational frequency to the desired level or pulling a portion of the RF shim 52 out of the shim holder 50 to increase the operational frequency. In the exemplary embodiment, when the RF shim is positioned at a point within the shim holder 50 that produces the desired operational frequency, the RF shim 52 is secured in place using, for example, the mechanical fastener 140 shown in FIG. 6 which applies a pressure to the RF shim 52.

In various other embodiments, the operational frequency of the RF body coil 10 may be modified by fabricating the RF shims 52 from a different dielectric material, by locating the RF shims 52 at different locations on the end rings, or by changing the size and/or volume of the RF shims 52. Moreover, it should be realized that the operational frequency of the RF body coil 10 may be modified while the RF body coil 10 is installed within the imaging system. More specifically, the operator may manually reposition the RF shims 52 or add additional RF shims 52 without removing the RF body coil 10 from the imaging system. Moreover, because the operational frequency may be modified without removing the RF body coil 10, the tuning accomplished at 206 is accomplished while maintaining the RF body coil 10 at the same position within the imaging system 400 thus reducing any resultant frequency changes that may occur when a conventional RF coil is removed and reinstalled into the imaging system.

Figure 12:
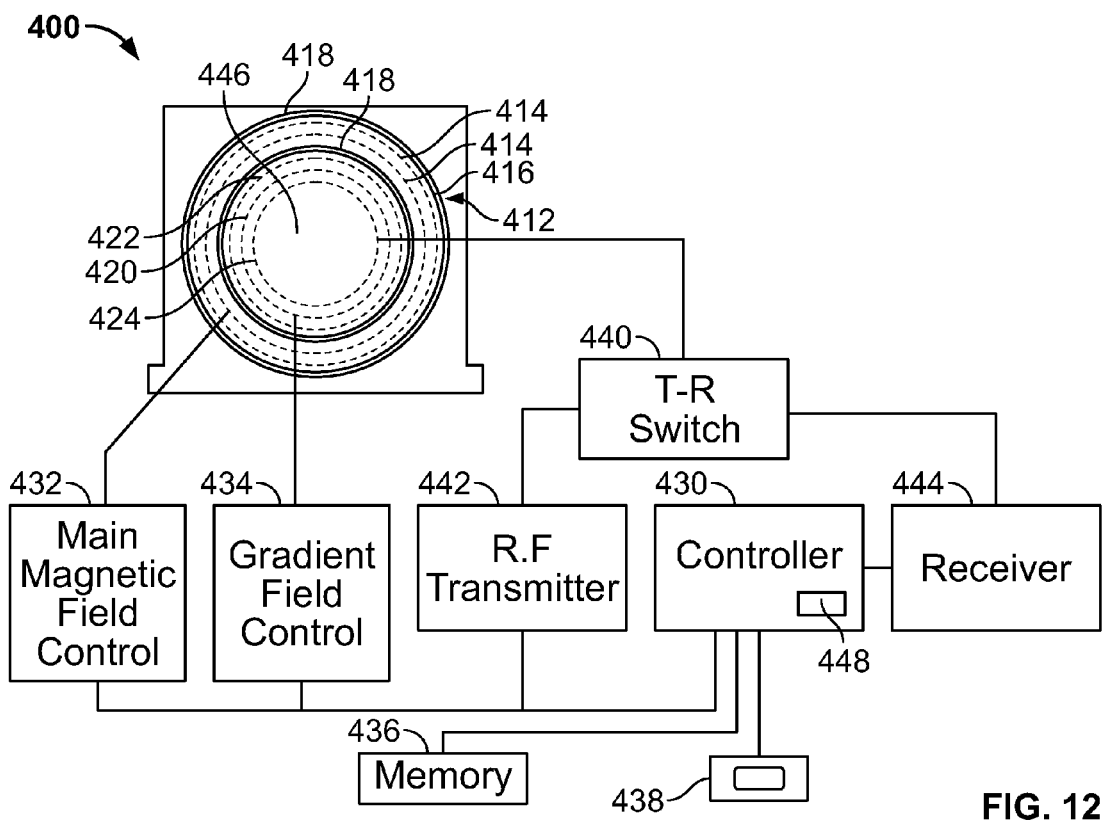
FIG. 12 is an exemplary magnetic resonance imaging (MRI) system formed in accordance with various embodiments.

Various embodiments described herein is to provide a method and system for tuning a MRI RF birdcage coil using dielectric materials that are disposed between the birdcage rung-endring structure and the RF shield. The frequency of RF birdcage coil may be tuned to the Larmor frequency by changing the dielectric constant of the dielectric material, by changing the dimensions (length/width/height) of the dielectric material, by changing the spatial location of the dielectric material in between RF birdcage coil rung-endring structure and the RF shield, and/or by changing the quantity of dielectric material in the space Various embodiments of the RF body coil 10 and methods described herein may be provided as part of, or used with, a medical imaging system, such as an imaging system 400 as shown in FIG. 12. It should be appreciated that although the imaging system 400 is illustrated as a single modality imaging system, the various embodiments may be implemented in or with multi-modality imaging systems. For example, the imaging system 400 is illustrated as an MRI system and may be combined with different types of medical imaging systems, such as a Computed Tomography (CT), Positron Emission Tomography (PET), a Single Photon Emission Computed Tomography (SPECT), as well as an ultrasound system, or any other system capable of generating images, particularly of a human. Moreover, the various embodiments are not limited to medical imaging systems for imaging human subjects, but may include veterinary or non-medical systems for imaging non-human objects, luggage, etc.

In the exemplary embodiment, the imaging system 400 includes a superconducting magnet assembly 412 that includes a superconducting magnet 414. The superconducting magnet 414 is formed from a plurality of magnetic coils supported on a magnet coil support or coil former. In one embodiment, the superconducting magnet assembly 412 may also include a thermal shield 416. A vessel 418 (also referred to as a cryostat) surrounds the superconducting magnet 414, and the thermal shield 416 surrounds the vessel 418. The vessel 418 is typically filled with liquid helium to cool the coils of the superconducting magnet 414. A thermal insulation (not shown) may be provided surrounding the outer surface of the vessel 418. The imaging system 400 also includes a main gradient coil 420, a shield gradient coil 422, and an RF transmit coil 424. The RF transmit coil 424 may be, for example, the RF body coil 10 described above. Accordingly, the RF transmit coil 424 may include the plurality of shim holders 50 and RF shims 52 as described above. The imaging system 400 also generally includes a controller 430, a main magnetic field control 432, a gradient field control 434, a memory 436, a display device 438, a transmit-receive (T-R) switch 440, an RF transmitter 442 and a receiver 444.

In operation, a body of an object, such as a patient (not shown), or a phantom to be imaged, is placed in the bore 446 on a suitable support, for example, a motorized table (not shown) or other patient table. The superconducting magnet 414 produces a uniform and static main magnetic field $B_0$ across the bore 446. The strength of the electromagnetic field in the bore 446 and correspondingly in the patient, is controlled by the controller 430 via the main magnetic field control 432, which also controls a supply of energizing current to the superconducting magnet 414.

The main gradient coil 420, which may include one or more gradient coil elements, is provided so that a magnetic gradient can be imposed on the magnetic field $B_0$ in the bore 446 in any one or more of three orthogonal directions x, y, and z. The main gradient coil 420 is energized by the gradient field control 434 and is also controlled by the controller 430.

The RF transmit coil 424, which may include a plurality of coils (e.g., resonant surface coils), is arranged to transmit magnetic pulses and/or optionally simultaneously detect MR signals from the patient, if receive coil elements are also provided. The RF transmit coil 424 and a receive surface coil, if provided, may be selectably interconnected to one of the RF transmitter 442 or receiver 444, respectively, by the T-R switch 440. The RF transmitter 442 and T-R switch 440 are controlled by the controller 430 such that RF field pulses or signals are generated by the RF transmitter 442 and selectively applied to the patient for excitation of magnetic resonance in the patient. Various embodiments may be used to form different coil configurations such as birdcage coils, transverse electromagnetic (TEM) coils, whole-body coils, and/or surface, or local, coils and for transmitting and/or receiving signals. Thus, while the exemplary embodiment is illustrated in a birdcage configuration.

Following application of the RF pulses, the T-R switch 440 is again actuated to decouple the RF transmit coil 424 from the RF transmitter 442. The detected MR signals are in turn communicated to the controller 430. The controller 430 includes a processor 448 that controls the processing of the MR signals to produce signals representative of an image of the patient. The processed signals representative of the image are also transmitted to the display device 438 to provide a visual display of the image. Specifically, the MR signals fill or form a k-space that is Fourier transformed to obtain a viewable image which may be viewed on the display device 438.

In various embodiments, the RF coil 424 is configured to generate signals at one or more resonate frequencies, for example, centered about the Larmor frequencies of proton (hydrogen nuclei) and/or carbon (e.g., $^{13}C$ nuclei). However, it should be noted that the RF transmitter 442 may be configured to generate other frequencies causing different nuclei to resonate at their Larmor frequencies. Moreover, the MR signals and the image(s) generated may be encoded using any known technique in the art.

The various embodiments and/or components, for example, the modules, or components and controllers therein, such as of the imaging system 400, also may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as an optical disk drive, solid state disk drive (e.g., flash RAM), and the like. The storage device may also be other similar means for loading computer programs or other instructions into the computer or processor.

As used herein, the term "computer" or "module" may include any processor-based or microprocessor-based system including systems using microcontrollers, reduced instruction set computers (RISC), application specific integrated circuits (ASICs), logic circuits, and any other circuit or processor capable of executing the functions described herein. The above examples are exemplary only, and are thus not intended to limit in any way the definition and/or meaning of the term "computer".

The computer or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments of the invention. The set of instructions may be in the form of a software program, which may form part of a tangible non-transitory computer readable medium or media. The software may be in various forms such as system software or application software. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "software" and "firmware" may include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. A radio frequency (RF) body coil comprising:
    a first end ring;
    a second end ring;
    a plurality of rungs connected between the first and second end rings;

at least one shim holder mounted to the first end ring, the shim holder having a shim holder opening, wherein the shim holder opening has a rectangular shape; and a RF shim having a rectangular shape and configured to be at least partially inserted into the shim holder opening to a position within the shim holder, the RF shim being repositionable within the shim holder by moving the RF shim relative to the shim holder opening to vary an operational frequency of the RF body coil.

2. The RF body coil of claim 1, wherein the RF body coil comprises a birdcage coil.

3. The RF body coil of claim 1, wherein the shim holder includes a set of stanchions that are utilized to couple the shim holder to the first end ring, the set of stanchions forming an air gap that separates a portion of the shim holder from the first end ring.

4. The RF body coil of claim 1, wherein the RF shim is configured to be adjusted between an initial insertion position and a fully inserted position within the shim holder to vary the operational frequency of the RF body coil, the RF shim extending from the shim hold at the initial insertion position, a larger portion of the RF shim being within the shim holder at the fully inserted position relative to the initial insertion position.

5. The RF body coil of claim 1, wherein the RF shim is movable between an initial insertion position towards a fully inserted position within the shim holder to vary the operational frequency of the RF body coil, wherein when the RF shim is at the initial insertion position a portion of the RF shim extends from the shim holder.

6. The RF body coil of claim 1, wherein the RF shim comprises a dielectric shim, the shim holder having a volume greater than a volume of the RF shim.

7. The RF body coil of claim 1, wherein the shim holder comprises a dielectric material and includes a fastener, wherein the fastener secures the RF shim to the position within the shim holder.

8. The RF body coil of claim 1, further comprising N rungs and (½)N shim holders, wherein (¼)N shim holders are mounted to the first end ring and (¼)N shim holders are coupled to the second end ring.

9. The RF body coil of claim 1, wherein the RF shim is repositionable within the shim holder to vary the operational frequency of the RF body coil while the RF body coil is installed within an imaging system.

10. A magnetic resonance imaging (MRI) system comprising:
a radio-frequency (RF) birdcage coil having a first end ring, a second end ring, and a plurality of rungs connected therebetween;
at least one shim holder mounted to the first end ring, the shim holder having a shim holder opening, wherein the shim holder opening has a rectangular shape; and
a RF shim having a rectangular shape and configured to be at least partially inserted into the shim holder opening to a position within the shim holder, the RF shim being repositionable within the shim holder by moving the RF shim relative to the shim holder opening to vary an operational frequency of the RF body coil.

11. The MRI system of claim 10, wherein the shim holder includes a set of stanchions that are utilized to couple the shim holder to the first end ring, the set of stanchions forming an air gap that separates a portion of the shim holder from the first end ring.

12. The MRI system of claim 10, wherein the RF shim is configured to be adjusted between an initial insertion position and a fully inserted position within the shim holder to vary the operational frequency of the RF body coil.

13. The MRI system of claim 10, wherein the RF shim is movable between an initial insertion position towards a fully inserted position within the shim holder to reduce the operational frequency of the RF body coil.

14. The MRI system of claim 10, wherein the RF shim comprises a dielectric shim and the shim holder having a volume greater than a volume of the RF shim.

15. The MRI system of claim 10, wherein the shim holder comprises a dielectric material and includes a fastener, wherein the fastener secures the RF shim to the position within the shim holder.

16. The MRI system of claim 10, wherein the RF body coil comprises N rungs and (½)N shim holders, wherein (¼)N shim holders are mounted to the first end ring and (¼)N shim holders are coupled to the second end ring.

17. The MRI system of claim 10, wherein the RF shim is repositionable within the shim holder to vary the operational frequency of the RF body coil while the RF body coil is installed within the MRI system.

18. A method for tuning a radio frequency (RF) body coil that includes a first end ring, a second end ring, and a plurality of rungs connected therebetween, said method comprising:
mounting at least one RF shim holder to the first end ring, the RF shim holder having a shim holder opening, wherein the shim holder opening has a rectangular shape;
obtaining an initial operational frequency of the RF body coil; and
adjusting a position of an RF shim disposed within the shim holder relative to the shim holder opening until the RF body coil is operating at a predetermined operational frequency, wherein the RF shim holder has a rectangular shape.

19. The method of claim 18, wherein the wherein the RF shim holder includes a set of stanchions that are utilized to couple the shim holder to the first end ring, the set of stanchions forming an air gap that separates a portion of the shim holder from the first end ring by an air gap.

20. The method of claim 18, wherein the RF shim is configured to be adjusted between an initial insertion position and a fully inserted position to vary the operational frequency of the RF body coil.

* * * * *